(12) United States Patent
Sharma et al.

(10) Patent No.: US 6,924,196 B1
(45) Date of Patent: Aug. 2, 2005

(54) ANTI-REFLECTIVE COATING AND PROCESS USING AN ANTI-REFLECTIVE COATING

(75) Inventors: Umesh Sharma, Newport Beach, CA (US); Kevin Q. Yin, Irvine, CA (US); Hong J. Wu, Irvine, CA (US); Suryanarayana Shivakumar Bhattacharya, Irvine, CA (US); Xiaoming Li, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/370,508

(22) Filed: Aug. 6, 1999

(51) Int. Cl.[7] .......................................... H01L 21/336
(52) U.S. Cl. ..................... 438/257; 438/745; 438/757
(58) Field of Search ................................ 438/264, 257, 438/294, 315, 786, 954, 712, 714, 717, 719, 438/723, 724, 736, 745–757; 257/314–315

(56) References Cited

U.S. PATENT DOCUMENTS

| | | | |
|---|---|---|---|
| 5,597,754 A | * | 1/1997 | Lou et al. .................... 438/398 |
| 5,605,601 A | * | 2/1997 | Kawasaki ................. 156/643.1 |
| 5,620,913 A | * | 4/1997 | Lee .............................. 438/264 |
| 5,968,324 A | * | 10/1999 | Cheung et al. ............. 438/786 |
| 6,030,541 A | * | 2/2000 | Adkisson et al. ........... 438/717 |
| 6,245,682 B1 | * | 6/2001 | Fu et al. ...................... 438/696 |

OTHER PUBLICATIONS

Wolf et al., Silicon Processing for the VLSI Era, 1986, vol. 1, p. 539-542.*
Wolf et al; Silicon Processing for the VLSI Era; vol. 1; 1986; p. 5 429-455, 518.*

* cited by examiner

*Primary Examiner*—Duy-Vu N Deo
(74) *Attorney, Agent, or Firm*—Farjami & Farjami LLP

(57) ABSTRACT

An anti-reflective coating for use in the fabrication of a semiconductor device includes a thin oxide layer and an overlying layer of silicon oxynitride. The anti-reflective layer is advantageously used in the fabrication of FLASH memory devices which include a layer of polycrystalline silicon and an underlying layer of silicon nitride. After being used to pattern the polycrystalline silicon and silicon nitride, the anti-reflective coating is removed in a solution of hot phosphoric acid with the removal taking place before the silicon oxynitride is exposed to any elevated temperatures.

21 Claims, 3 Drawing Sheets ized. If the etching of polycrystalline silicon layer 22 to form the control gates and associated structure is not carefully controlled, device yield and reliability will be adversely affected.

ANTI-REFLECTIVE COATING AND PROCESS USING AN ANTI-REFLECTIVE COATING

BACKGROUND OF THE INVENTION

This invention relates to an anti-reflective coating and to a method for fabricating a semiconductor device including the steps of depositing and etching an anti-reflective coating.

The fabrication of semiconductor devices relies repeatedly on the photo lithographic transfer of a pattern from a mask onto the surface of a coated semiconductor wafer. During the photo lithographic process light passes through the patterned mask and the pattern is transferred to a photoresist layer coating the wafer. Ideally the pattern on the mask is exactly replicated in the photoresist layer. When the photoresist layer is coated on a highly reflective film such as a metal layer or a polycrystalline silicon layer, however, light reflections from the reflective layer can interfere with the exact replication of the pattern. Light that is off-normal can be reflected back through the photoresist layer to expose portions of the layer that were intended to be masked. This is especially significant if there are severe steps in the topography of the underlying substrate because incident light can be reflected off those severe steps and again cause unwanted exposure of the photoresist coating.

Organic anti-reflective coating (ARC) films have been extensively used in the semiconductor industry to reduce reflectivity and to ameliorate the above-described problem. The organic ARC films have not been totally satisfactory, however, especially as the devices being fabricated have become more complex, feature sizes of those devices have been reduced, and surface topography has become less planar. The organic ARC films tend to be relatively thick, non-uniform in thickness because applied as a liquid, and generally unable to maintain critical dimensions on the device. This is especially true as the photo lithographic systems have shifted to shorter wavelengths.

Because of the shortcomings of organic ARC films, the semiconductor industry is looking toward inorganic ARC films. The inorganic anti-reflective coatings reduce the undesired reflected light by phase-shift cancellation of specific wavelengths. Conventional inorganic ARC films, however, are not easily integrated into the process for fabricating some of the complex, state of the art semiconductor devices. Problems arise both with the deposition of inorganic ARC films having the desired properties and with the subsequent removal of those films at the completion of the photo lithographic process.

In accordance with the various embodiments of the present invention an anti-reflective coating which overcomes problems attendant with previous photo lithographic processes is described. Also described is a process for forming and subsequently removing an anti-reflective coating and for the fabrication of a semiconductor device.

DETAILED DESCRIPTION OF PREFERRED EMBODIMENTS

One embodiment of the invention relates to an anti-reflective coating which can be utilized in the fabrication of semiconductor devices. Another embodiment of the invention relates to a method for etching a silicon oxynitride layer which can be utilized in forming an anti-reflective coating film. Further embodiments of the invention relate to processes for fabricating a semiconductor device utilizing an anti-reflective coating film. Although the various embodiments of the invention can be utilized in fabricating many types of semiconductor devices, the invention will be illustrated in connection with and is especially applicable to the fabrication of a FLASH memory device.

Figure 1:
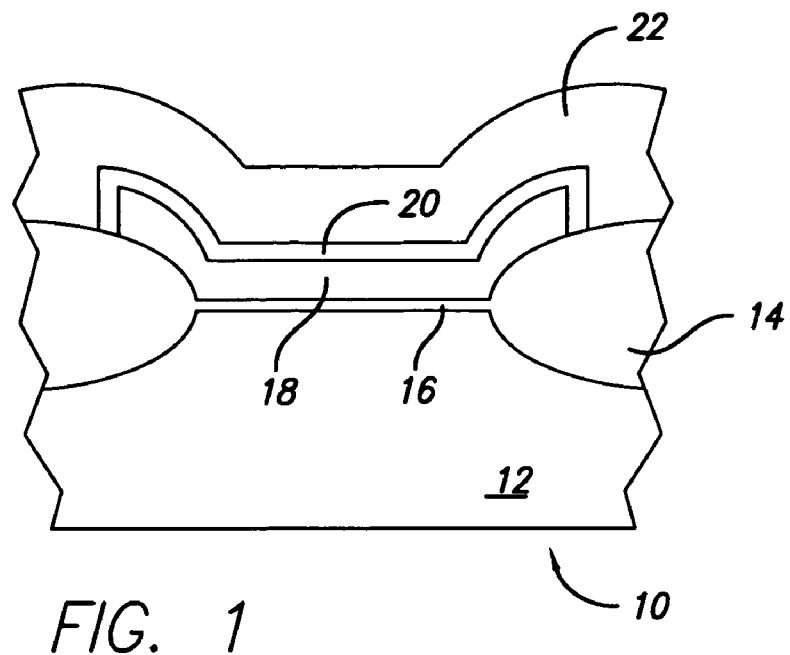
FIGS. 1 through 6 illustrate, in cross section, process steps in the fabrication of a partially completed semiconductor device in accordance with one embodiment of the invention.

FIG. 1 illustrates, in cross-section, a portion of a partially completed semiconductor FLASH memory device 10. The partially completed device 10 includes a semiconductor substrate 12 that is divided into active device regions by a field oxide 14. Only one active device region is illustrated, but those skilled in the art will understand how the surface of the substrate can be divided into the required number of isolated active device regions. In the active device region illustrated, a thin gate oxide 16 is formed on the surface of substrate 12. Overlying gate oxide 16 is a floating gate electrode 18 formed of polycrystalline silicon. A dielectric layer 20 is formed on the floating gate electrode. Layer 20 serves an important role in the functioning of the FLASH memory device, as is well known in the memory art. Because of the juxtaposition of the dielectric layer between two polycrystalline silicon elements, as will be apparent from the following description, dielectric layer 20 is hereinafter referred to as an "interpoly dielectric." In a preferred embodiment, interpoly dielectric 20 is a three layer structure (the three separate layers are not illustrated in the figure) including a bottom oxide layer having a thickness of about 8 nm, a middle layer of silicon nitride having a thickness of about 10 nm, and a top layer of oxide having a thickness of about 6.5 nm. The bottom oxide can be formed by the thermal oxidation of the surface of the polycrystalline silicon of floating gate 18. The nitride layer and top oxide layer can be formed by chemical vapor deposition. As illustrated, the floating gate and interpoly dielectric have been patterned in known manner during previous process steps.

A second polycrystalline silicon layer 22 is formed over the surface of the structure including the interpoly dielectric layer 20. The layer of polycrystalline silicon 22, which can be deposited, for example, by chemical vapor deposition, will be used to form the control gate of the FLASH memory device as well as gate electrodes and interconnects for other non-memory devices utilized in the completed integrated circuit. The patterning of polycrystalline silicon layer 22 to form gate electrodes and interconnects having carefully controlled dimensions presents serious problems in the fabrication of semiconductor devices. This is especially true as the increasing complexity of integrated circuits requires the size of critical features utilized in the integrated circuit to be made smaller and smaller. The patterning of polycrystalline silicon layer 22 is preferably carried out in two steps as illustrated below. Polycrystalline silicon layer 22 is first patterned to form interconnects and the gate electrodes of non-memory devices. During this first patterning, the portion of layer 22 directly over the memory device is not etched. During the second patterning, the interconnects and the gate electrodes of non-memory devices are protected from etching and the control gates and associated structure of the memory device are patterned.

Figure 2:
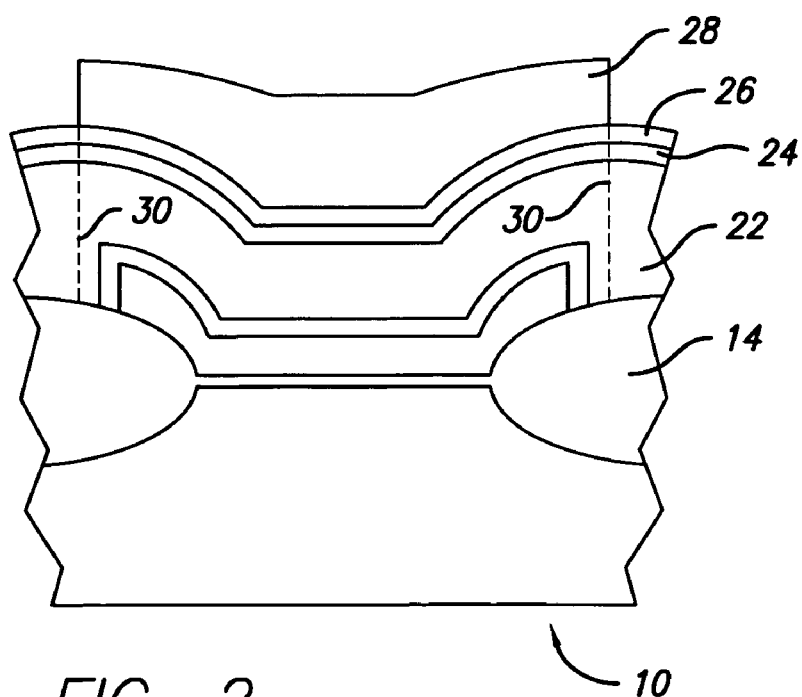

Process steps for the first patterning of polycrystalline silicon layer 22 are illustrated in FIG. 2. An anti-reflective coating (ARC) film is applied to the surface of polycrystalline silicon layer 22. In accordance with the invention, the ARC film is a two layer structure including a first layer 24 of oxide and an overlying second layer 26 of silicon oxynitride. In a preferred embodiment, I-line photolithography is used for patterning the critical dimension layers including the patterning of polycrystalline silicon layer 22. In accordance with this preferred embodiment, the characteristics of the antireflective layer as herein illustrated are designed for the I-line wavelength of 365 nm. Deposition conditions for the silicon oxynitride determine the thickness and the extinction coefficient (the imaginary term in the refractive index) of the layer, important terms in matching the antireflective properties of the ARC film to the photo lithographic wavelength selected. Oxide layer 24 preferably has a thickness of about 8 nm and is deposited by chemical vapor deposition from a TEOS source. Deposition conditions and equipment for such chemical vapor deposition are well known to those of skill in the art. Silicon oxynitride layer 26 preferably has a thickness of about 26 nm and is deposited by plasma enhanced chemical vapor deposition. The silicon oxynitride can be deposited, for example, in deposition equipment commercially available from Novellus. To achieve optimum results for the I-line lithography the silicon oxynitride is deposited at a deposition temperature of about 400° C., at a pressure of 2.6 Torr, with an RF power of about 300 watts. The silicon oxynitride is deposited from $SiH_4$, $N_2O$ and nitrogen. In the preferred embodiment, the flow rates are: $N_2O$ 9500 sccm, $SiH_4$ 303 sccm and $N_2O$ 247 sccm. It has been found that the ratio of $SiH_4$ to $N_2O$ controls the optical parameters of the silicon oxynitride film such as the refractive index and the extinction coefficient. For use with I-line lithography and for an anti-reflective coating film having an oxide thickness between about 7.5 nm to 10 nm and having a silicon oxynitride thickness of about 25 nm to about 30 nm, an extinction coefficient of about 0.03±0.003 is preferred. To achieve such film characteristics the ratio of $SiH_4$ to $N_2O$ is preferably maintained in the range of 0.9-1.5:1 and most preferably is maintained at a ratio of about 1.22:1.

Continuing with the description of the process illustrated in FIG. 2, a layer of photoresist 28 is deposited on the anti-reflective coating film and is patterned, preferably using I-line lithography to achieve the pattern illustrated. The ARC film aids in replicating the pattern from a mask (not shown) in the photoresist layer 28. The use of the ARC film reduces reflections from, for example, the steps in the underlying polycrystalline silicon layer 22 caused by that layer passing over the edge of the field oxide 14. The patterned photoresist 28 will subsequently be used to etch the anti-reflective coating layers 26 and 24 as well as the underlying polycrystalline silicon layer 22 to the shape and size illustrated by the dashed lines 30. The patterning of photoresist layer 28 and the subsequent etching of the underlying layers masked by the photoresist layer are well known and will not be described further.

Figure 3:
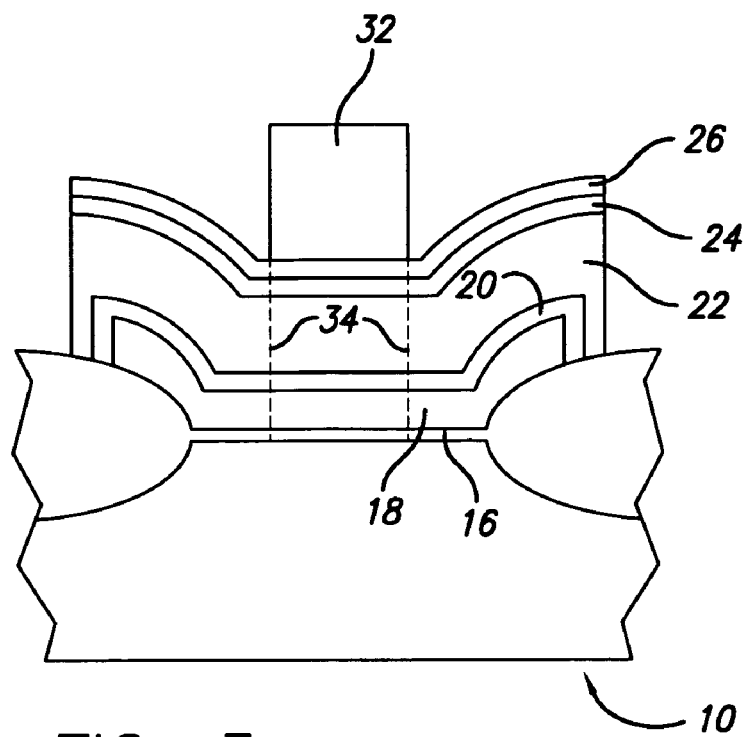

Following the first etching of polycrystalline silicon layer 22, as described above, to form the interconnects and gate electrodes of the non-memory transistors included in the integrated circuit, the very important and critical etching of the memory device itself is accomplished. During the first etching of polycrystalline silicon layer 22, the portion of layer 22 located over the memory device is protected and remains unetched. FIG. 3 is a cross-section through the partially fabricated memory device taken in a section perpendicular to the view illustrated in FIG. 2. The process step illustrated is known as the "stack etch" because of the stacked nature of the several layers in the resulting structure. The previously applied photoresist layer 28 is removed and an additional layer of photoresist is applied and patterned to form patterned photoresist region 32 overlying the anti-reflective coating film. The objective in this process step is to etch through both polycrystalline silicon layers 22 and 18, interpoly dielectric layer 20 and gate oxide layer 16 to form a stacked structure bounded by the dashed lines 34. The etching is accomplished by reactive ion etching or other directional etching as is well known in the art. Again, the ARC film aids in replicating the pattern from a mask (not shown) in the photoresist layer 32 The use of the ARC film reduces reflections from, for example, any underlying steps in the topography. Such steps may be especially severe at this stage of the device processing because the steps now also include those steps found at the edge of polycrystalline silicon layer 22 as previously patterned.

Figure 4:
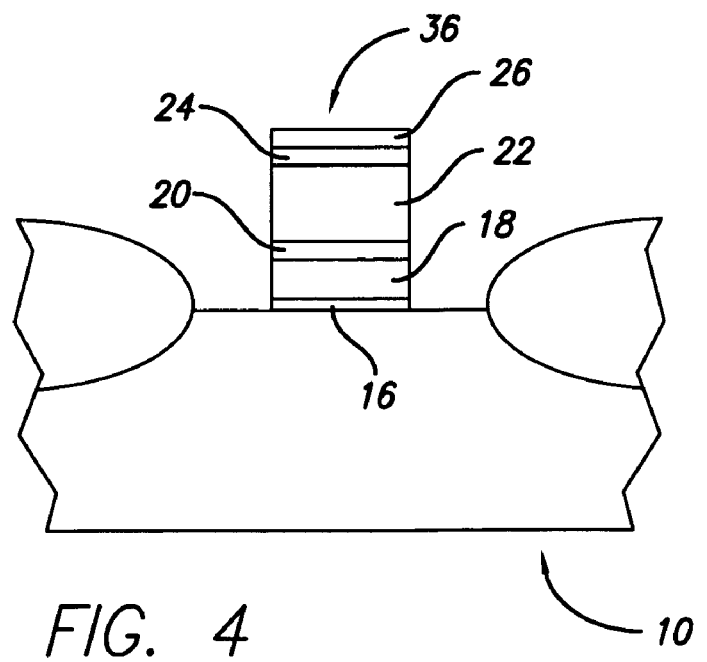

FIG. 4 illustrates a stacked structure which results from the etching described above and the subsequent removal of patterned photoresist portion 32. The stacked structure includes a first gate oxide 16, floating gate 18, interpoly dielectric 20 and control gate 22. The stacked structure is precisely aligned with respect to the active area with each of the layers of the structure aligned to the layers above and below. The stacked structure, at this point in the process, also includes layers 24 and 26 of the anti-reflective coating film. It remains to remove the anti-reflective coating from the top of the stack so that the processing can continue. Removal of the silicon oxynitride layer 26 must be accomplished without serious etching of the edges of any of the layers of the stack structure, and especially without any serious etching of the exposed edge of the silicon nitride included in the interpoly dielectric. Plasma etching of the silicon oxynitride layer 26 has proved unsuccessful because high etch selectivity of silicon oxynitride to exposed silicon is very difficult to achieve.

Hot phosphoric acid is well known as an etchant for silicon nitride. It has been discovered, in accordance with the invention, that the as-deposited silicon oxynitride also can be etched in hot phosphoric acid provided that the silicon oxynitride has not been exposed to any temperatures in excess of about 400° C. prior to the etching step. If the stack structure 36 has been re-oxidized after the polycrystalline silicon etch, as is a routine process in many MOS process technologies, the etch rate of the silicon oxynitride in hot phosphoric acid is only about 0.2 nm per minute. At this etch rate, the amount of time required to remove silicon oxynitride layer 26 would cause serious etching of the exposed edge of the silicon nitride included in interpoly dielectric layer 20. In accordance with the invention, however, etching of the silicon oxynitride film 26 prior to any high temperature heat treatment results in an etch rate in the hot phosphoric acid of about 6 nm per minute. At such an etch rate silicon oxynitride layer 26 can be totally removed without deleteriously etching the exposed edge of the silicon nitride. The hot phosphoric acid etching of silicon oxynitride is carried out with the same etch composition and etch conditions as is the well know etching of silicon nitride.

Figure 5:
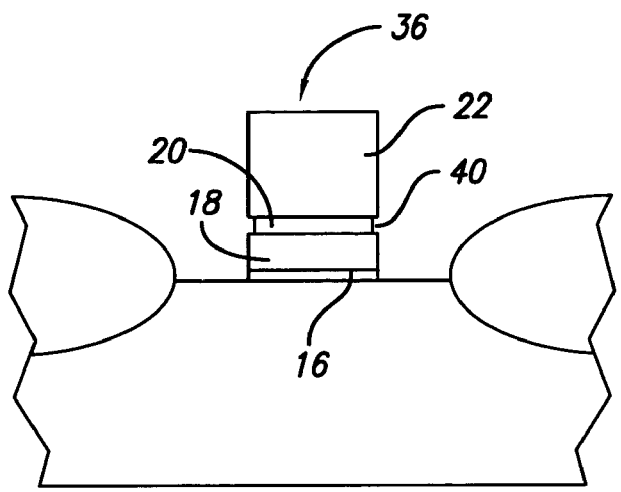

FIG. 5 illustrates, in cross-section, the resulting stack structure after removal of the silicon oxynitride layer 26 in hot phosphoric acid. The slight etching of the exposed edge of the nitride layer included in the interpoly dielectric layer is noted by the notch 40. The thin oxide layer 24 is also shown to have been removed in this view. Oxide layer 24 is easily removed in known manner.

Figure 6:
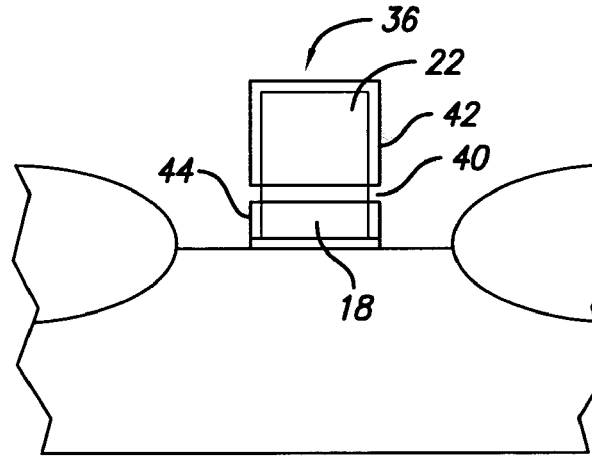

To avoid any problems that might result from the notch 40, in a preferred embodiment the exposed edges of the polycrystalline silicon exposed at the edges of stack structure 36 are oxidized. FIG. 6 illustrates, in cross-section, the stack structure 36 after the exposed edges of polycrystalline silicon layer 22 and floating gate 18 have been reoxidized. The reoxidation is accomplished by placing the structure in an oxidizing ambient at an elevated temperature for a sufficient time to grow oxide layer 42 on polycrystalline silicon layer 22 and oxide layer 44 on floating gate 18. Oxide layers 42 and 44 are grown to a thickness of about 10 nm so that the edges of the floating gate 18 and the control gate 22 are again brought into alignment with the edge of the silicon nitride layer that was etched during the removal of the anti-reflective coating film.

Figure 7:
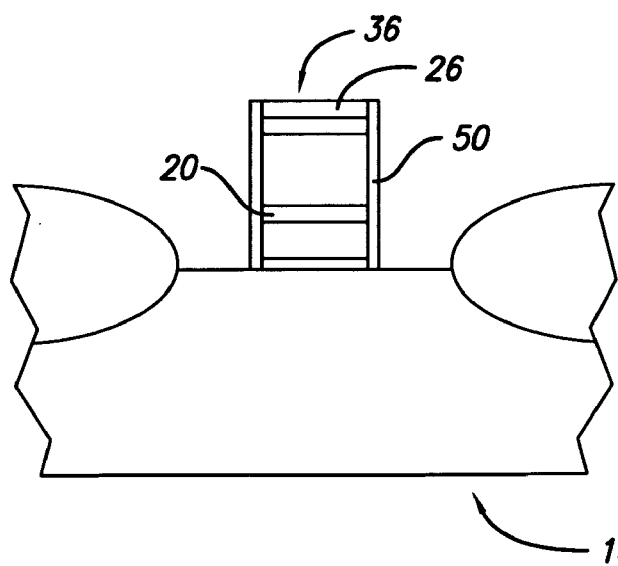
FIG. 7 illustrates, in cross-section, process steps for the fabrication of a semiconductor device in accordance with a further embodiment of the invention.

FIG. 7 illustrates, in cross-section, an alternate embodiment of the invention. To protect the edge of the silicon nitride included in interpoly dielectric layer 20 during the etching of silicon oxynitride layer 26, a layer of oxide is deposited by low temperature chemical vapor deposition to cover all exposed surfaces of the device. This oxide layer can be deposited, in known manner, for example by plasma enhanced CVD from a TEOS source, at a temperature of less than 400° C. The deposited oxide layer is then exposed to a reactive ion etch which selectively removes the oxide from exposed horizontal surfaces while leaving a sidewall oxide 50 on vertical surfaces. The process of reactive ion etching or other directional etching to leave sidewall oxide 50 is well known in the art. Sidewall oxide 50 serves to protect the previously exposed edge of the nitride layer included in interpoly dielectric layer 20. The silicon oxynitride layer 26 can then be etched, in accordance with the invention, in hot phosphoric acid without etching the interpoly dielectric layer. By depositing the oxide to form sidewall oxide 50 at a temperature of less than about 400° C., the rapid etchability of silicon oxynitride layer 26 in hot phosphoric acid is maintained.

The processing of the structure illustrated in either FIG. 6 or FIG. 7 can then continue, in known manner, to complete the semiconductor device structure. The remaining steps include, for example, the formation of diffused or otherwise doped regions in substrate 12, the provision of contacts and interconnections, and the like.

Thus it is apparent that there has been provided, in accordance with the invention, an anti-reflective coating, a method for etching a silicon oxynitride layer and a process for fabricating a semiconductor device. Although the invention has been described and illustrated with reference to preferred embodiments thereof, it is not intended that the invention be limited to these preferred embodiments.

What is claimed is:

1. A process for fabricating a semiconductor device comprising the steps of:
   providing a semiconductor substrate;
   forming a silicon nitride layer overlying the substrate;
   deposition a layer of polycrystalline silicon overlying the silicon nitride layer;
   forming an anti-reflective coating overlying the layer of polycrystalline silicon, the anti-reflective coating comprising a first layer of oxide and a second layer of silicon oxynitride overlying the first layer;
   pattern etching the anti-reflective coating, the layer of polycrystalline silicon and the silicon nitride layer to form a stack, the stack having an edge and a top;
   removing the remaining layer of silicon oxynitride in the stack by etching in hot phosphoric acid before subjecting the layer of silicon oxynitride to any temperature greater than about 400° C.;
   oxidizing the layer of polycrystalline silicon in the stack after the step of removing the remaining layer of silicon oxynitride in the stack.

2. The process of claim 1 wherein the step of forming an anti-reflective coating comprises the step of depositing a thin layer of silicon oxide by chemical vapor deposition from a TEOS source.

3. The process of claim 1 wherein the step of forming an anti-reflective coating comprises the step of depositing a layer of silicon oxynitride by plasma enhanced chemical vapor deposition from reactants $N_2O$ and $SiH_4$.

4. The process of claim 3 wherein the ratio of $SiH_4$ to $N_2O$ reactants is maintained at about 1.22:1.

5. The process of claim 3 wherein the ratio of $SiH_4$ to $N_2O$ reactants is maintained in the range of about 0.9–1.5:1.

6. A process for etching silicon oxynitride which comprises the steps of:
   depositing a layer of polycrystalline silicon overlying a substrate;
   depositing a layer of silicon oxynitride overlying the layer of polycrystalline silicon;
   pattern etching the layer of silicon oxynitride and the layer of polycrystalline silicon to form a stack, the stack having an edge: and
   etching the remaining layer of silicon oxynitride in the stack in a phosphoric acid etchant without subjecting the layer of silicon oxynitride to any temperature greater than about 400° C. after the step of depositing the layer of silicon oxynitride;
   forming a layer of oxide on the edge of the stack after the step of etching the remaining layer of silicon oxynitride in the stack.

7. A process for fabricating a semiconductor device comprising the steps of:
   depositing a layer of polycrystalline silicon overlying a substrate;
   depositing a first layer of oxide to a thickness of between about 7.5 nm and 10 nm by chemical vapor deposition from a TEOS source overlying the layer of polycrystalline silicon;
   depositing a second layer of silicon oxynitride overlying the first layer to a thickness of between about 25 nm and about 30 nm by plasma enhanced chemical vapor deposition;
   pattern etching the first and second layers and the layer of polycrystalline silicon to form a stack; and
   etching the second layer in the stack in an etchant comprising hot phosphoric acid, the etching occurring before the second layer is subjected to any temperature greater than about 400° C.;
   oxidizing the layer of polycrystalline silicon in the stack after the step of etching the second layer in the stack.

8. The process of claim 7 wherein the step of depositing a second layer of silicon oxynitride comprises depositing a layer from reactants comprising $N_2O$ and $SiH_4$ and controlling the ratio of reactants to vary the extinction coefficient of the second layer.

9. The process of claim 8 wherein the ratio of reactants ($SiH_4$ to $N_2O$) is controlled to about 0.9–1.5:1.

10. The process of claim 9 wherein the ratio of reactants is controlled to about 1.22:1.

11. A process comprising:
    providing a semiconductor substrate;
    forming a gate oxide above the semiconductor substrate;

forming a first polycrystalline silicon layer over the gate oxide;

forming an interpoly dielectric;

forming a second polycrystalline silicon layer over the interpoly dielectric;

depositing a layer of silicon oxynitride above the second polycrystalline silicon layer;

pattern etching the layer of silicon oxynitride, the second polycrystalline silicon layer, the interpoly dielectric, the first polycrystalline silicon layer, and the gate oxide to form a stack, the stack having an edge; and removing the layer of silicon oxynitride in the stack without subjecting the layer of silicon oxynitride to a temperature greater than about 400° C. after the step of depositing the layer of silicon oxynitride;

forming a layer of oxide on the edge of the stack after the step of removing the layer of silicon oxynitride in the stack.

12. The process of claim 11, wherein the layer of silicon oxynitride is deposited by a plasma enhanced chemical vapor deposition process using the reactants $N_2O$ and $SiH_4$.

13. The process of claim 12, wherein the ratio of $SiH_4$ to $N_2O$ is maintained in the range of about 0.9–1.5:1.

14. The process of claim 12, wherein the ratio of $SiH_4$ to $N_2O$ is maintained at about 1.22:1.

15. The process of claim 11, wherein the interpoly dielectric is silicon nitride.

16. The process of claim 11, wherein the removing of the layer of silicon oxynitride comprises the step of etching with hot phosphoric acid.

17. A process comprising:

depositing a layer of polycrystalline silicon over a substrate;

depositing a layer of silicon oxynitride above the layer of polycrystalline silicon;

pattern etching the layer of silicon oxynitride and the layer of polycrystalline silicon to form a stack, the stack having an edge;

removing the layer of silicon oxynitride in the stack before subjecting the layer of silicon oxynitride to a temperature greater than about 400° C. after the step of depositing the layer of silicon oxynitride, and forming a layer of oxide on the edge of the stack after the step of removing the layer of silicon oxynitride in the stack.

18. The process of claim 17, wherein the layer of silicon oxynitride is deposited by a plasma enhanced chemical vapor deposition process using the reactants $N_2O$ and $SiH_4$.

19. The process of claim 18, wherein the ratio of $SiH_4$ to $N_2O$ is maintained in the range of about 0.9–1.5:1.

20. The process of claim 19, wherein the ratio of $SiH_4$ to $N_2O$ is maintained at about 1.22:1.

21. The process of claim 17, wherein the removing of the layer of silicon oxynitride comprises the step of etching with hot phosphoric acid.

* * * * *